United States Patent [19]
Brown et al.

[11] Patent Number: 6,097,068
[45] Date of Patent: Aug. 1, 2000

[54] SEMICONDUCTOR DEVICE FABRICATION METHOD AND APPARATUS USING CONNECTING IMPLANTS

[75] Inventors: Jeffrey Scott Brown, Jeffersonville; Stephen Scott Furkay, South Burlington; Robert John Gauthier, Jr., Burlington; Xiaowei Tian; Minh Ho Tong, both of Essex Junction; Steven Howard Voldman, South Burlington, all of Vt.

[73] Assignee: International Business Machines Corporation, Armonk, N.Y.

[21] Appl. No.: 09/010,870

[22] Filed: Jan. 22, 1998

Related U.S. Application Data

[63] Continuation of application No. 08/821,553, Mar. 21, 1997.

[51] Int. Cl.[7] .................................................. H01L 29/76
[52] U.S. Cl. .......................................... 257/371; 257/372
[58] Field of Search ..................................... 257/301, 371, 257/357, 372

[56] References Cited

U.S. PATENT DOCUMENTS

| | | | |
|---|---|---|---|
| 4,855,244 | 8/1989 | Hutter et al. ............................. | 257/592 |
| 5,049,959 | 9/1991 | Satoh ....................................... | 257/301 |
| 5,179,036 | 1/1993 | Matsumoto .............................. | 257/552 |
| 5,198,689 | 3/1993 | Fujioka .................................... | 257/592 |
| 5,302,534 | 4/1994 | Monk et al. ............................. | 257/592 |
| 5,359,221 | 10/1994 | Miyamoto et al. ..................... | 257/345 |
| 5,429,956 | 7/1995 | Shell et al. .............................. | 438/291 |
| 5,677,209 | 10/1997 | Shon et al. .............................. | 438/363 |
| 5,702,973 | 12/1997 | Mitani et al. ............................ | 438/16 |

*Primary Examiner*—Mark V. Prenty
*Attorney, Agent, or Firm*—Eugene I. Shkurko; Richard A. Henkler

[57] ABSTRACT

A semiconductor device and method of fabrication for such device in which a P– epitaxial layer is positioned above a P++ substrate. A P++ buried layer implant is positioned within the device between the P++ substrate and the P– epitaxial layer. A connecting p+ implant is placed within the epitaxial layer above the buried p+ blanket layer implant. In one exemplary embodiment, the device includes a shallow P-well with the P+ connecting implant in a position within the epitaxial layer connecting the shallow P-well and the buried P+ blanket implant layer.

5 Claims, 8 Drawing Sheets

SEMICONDUCTOR DEVICE FABRICATION METHOD AND APPARATUS USING CONNECTING IMPLANTS

This application is a Continuation of application Ser. No. 08/821,553 filed Mar. 21, 1997.

FIELD OF THE INVENTION

The present invention relates generally to semiconductor devices and more particularly to an improved semiconductor structure and method of fabrication for CMOS semiconductor devices and integrated VLSI semiconductor chips.

BACKGROUND OF THE INVENTION

Each new generation of semiconductors scales down the geometric dimensions of MOSFETs in CMOS circuits for improved speed and density. To maintain geometric similitude, all dimensions, such as MOSFET channel length, channel width, gate dielectric, junction depth, salicide thickness, well depth and epitaxial (epi) depth, are scaled by a constant parameter. To insure MOSFET reliability, the electric fields in the MOSFET are not scaled.

Electrical performance and power capabilities are also influenced as MOSFETs are scaled. Dimensional scaling decreases the MOSFET current and power dissipation. Scaling also leads to faster transistor speeds. Under scaling constraints, gate and drain voltages are scaled while well, epi and source/drain doping concenions are scaled. In an ideal formulation, the sheet resistance of the source/drain, well and epitaxial scales as unity.

As CMOS technology is highly scaled, the vertical dimensions of the well and epitaxy as quickly as the lateral dimensions. Epi thickness and n-well implants may have to be maintained with scaling to allow room for retrograde well implants, etc., in order to maintain MOSFET dence performance and other design criteria. Without proper scaling of the epitaxy and well implants, latchup immunity will decrease with technology scaling.

The scaling of the well and epitaxial region has an influence on CMOS latchup immunity, electrostatic discharge (ESD) protection, well sheet resistance and capacitance, noise immunity, soft error rate sensitivity, MOSFET snapback, MOSFET capacitance, diode series resistance, and other device design parametrics. Epitaxial layer thickness for a trench DRAM cell process is driven by denuded zone requirements, hot process, and n-well compensation effects. The epitaxial thickness is constrained by trench storage node capacitance, n-well-to-substrate capacitance, and trench gate induced diode leakage (TGIDL) current mechanism requirements. The epitaxial optimization is followed by retrograde n-well optimization, both of which are compatible with DRAM and logic development. This requires that the n-well and p-well design allows for reducing of DRAM storage node array leakage mechanisms for DRAM retention and cell retention, reducing parasitic pnp bipolar current gain, and achieving n-well sheet resistance requirements without impacting p+ MOSFET junction capacitance.

CMOS latchup is a parasitic effect initiated by a parasitic pnp transistor and a parasitic npn transistor forming a parasitic pnpn. Latchup occurs when a large current flows from the pnpn anode to cathode. When a pnpn device triggers, the pnpn undergoes a transition from a low current, high voltage state to a low voltage, high current state. In some cases, the low voltage high current state can lead to thermal runaway and destruction of the elements involved in the formation of the pnpn parasitic element. From a CMOS latchup perspective, the lateral spacings are decreasing, which makes it harder to maintain latchup as CMOS scales. As the technologies scale, the isolation depth is also scaling. The scaling of the isolation also reduces the latchup immunity of the technology. Latchup parasitic gains are a function of well design and p+/n+ spacings. Well profile design, number of implants, doses and energies can significantly vary latchup immunity of a technology. The lateral and vertical profile can influence the parasitic bipolar gain of the lateral and vertical parasitic transistors, respectively. Additionally, latchup is a function of the resistance shunt between the emitter and base of both the pnp and npn transistors. To maintain a low resistance path between the emitter and base of the pnp transistor, high dose implant n-well type retrograde well structures have been used. To maintain a low resistance path between the emitter and base of the npn transistor, high dose implant p-well type retrograde well structures have been used. However, scaling is not maintained because the lateral scaling of dimensions occurs at a faster rate than the vertical scaling dimensions. As a result, significant resistance is established between the well structures and the base substrate and epitaxial wafer as the CMOS technology is scaled even with the existence of retrograde n-well and p-well structures.

In addition to the p-well and n-well structures, a p++ substrate is used to reduce the low resistance path between the emitter and base of the parasitic npn transistor. An epitaxial film is placed on the p++ substrate to form the CMOS devices. From the hot processing, the dopants of the p++ substrate diffuse into the epitaxial region creating an epitaxial flat zone and a smooth dopant transition to the p++ dopant region. This epitaxial film thickness is decreased with continued scaling of CMOS technology. Control of the epitaxial film thickness has become a significant problem in the continuous scaling of the epitaxial film. When the epitaxial film is too thick, the dopants do not diffuse deep enough into the p– epitaxial region, and as a result, the epi resistance is too high and the n-well capacitance significantly decreases. When the epitaxial film is too thin, the p++ dopants compensate the n-well, causing variable n-well sheet resistance. Epitaial film thickness control leads to being able to maintain the n-well and p-well sheet resistance and capacitance and achieve a process where latchup, SER and ESD objectives are met.

ESD circuit response is also dependent upon epitaxial thickness and n-well design. Epitaxial regions on p+ substrates are scaled in CMOS technology with each technology generation. For technologies with high n-well sheet resistance, scaling the epitaxial thickness will increase the vertical bipolar gain of the vertical pnp formed by the p+ diode, well and p+ substrate. Hence, ESD immunity will improve as the vertical bipolar gain improves. For low n-well sheet-resistance technologies, ESD protection is provided by the diode rather than the vertical bipolar pnp element. Epitaxial scaling degrades ESD protection even though the vertical bipolar gain improves. This is because the ESD immunity is dominated by the ability for the diode to turn-on and discharge to the power rail. As the epitaxial thickness is scaled to a fixed well implant dose, it defines the well depth to first order. Varying the epitaxial thickness modifies the well profile differently than when the well implant dose is increased. In the case of retrograde or low sheet resistance scaled CMOS technology, it has been shown that the lower the resistance, the better the ESD immunity of the process. An important ESD parameter is the "intrinsic temperature". The intrinsic temperature is the temperature at which the intrinsic carrier concentration exceeds the dopant concentration. Increasing the doping concentration increases the intrinsic temperature thereby avoiding thermal runaway. Hence by increasing the dopant concentration in the active regions of the ESD networks, a more ESD immune technology can be created.

"Soft error rate" (SER) from ionizing particles is the result of alpha particles and cosmic rays.

Epitaxial thickness and well doping concenration and profiling can influence the diffusion of electron-hole pairs generated by the ionizing radiation. The existence of the p+ wafer improves SER in semiconductor chips. In the epitaxial wafer, in the region where the dopants diffuse into the epitaxial film, the doping concentration is lower and a doping gradient exists. The presence of a lower dopant concentration and the built-in electric field allows for ionized radiation-generated minority carriers to diffuse toward the active circuits near the device surface. Thus it is desirable to provide a solution to reduce the gradient dopant region in the p– epitaxial and p+ substrate region under the n-doped MOSFET diffusions.

MOSFET "snapback" is also a concern in advanced CMOS for burnin voltage stressing and ESD protection. MOSFET snapback occurs when a large voltage is applied to the drain such that avalanche breakdown occurs on the drain-substrate metallurgical junction. The avalanche current initiates a voltage drop between the MOSFET and electrical contacts, leading to the forward biasing of the MOSFET source. The effect causes the transistor to undergo a transition into low voltage, high current state. As the MOSFET channel length scales, the snapback voltage decreases. As a result the maximum applied voltage must be decreased to avoid MOSFET snapback during burnin applications. As the MOSFET scales, without decreasing the epitaxial thickness, MOSFET snapback will not scale with the power supply voltage and channel length. Thus there is a need to provide a solution which is effective to allow proper scaling of the MOSFET snapback with the power supply and channel lengths according to scaling theory.

In the use of tub resistor element applications, n-well resistors are used as in I/O driver design for impedance matching and ESD protection. With a variable epitaxial thickness, due to tolerance, a p++ substrate and retrograde n-well, poor tolerance exists for these circuit elements. There is, therefore, a need to provide a semiconductor construction and method of fabrication which provides good tolerance and control of the n-well sheet resistance for n-wells in a p++ wafer and a thin p– epitaxial film.

Moreover, in tub capacitor elements, n-wells are used as capacitor structures for Vdd capacitance and reduction of noise bounce in dynamic random access memory (DRAM) arrays. The extra Vdd capacitance is useful for both functionality and ESD protection. A variable epitaxial thickness due to tolerance, a p++ substrate and retrograde n-well, poor control is achieved over the n-well capacitance. Accordingly, there is a need to find a semiconductor construction and method of fabrication which provides good tolerance and control of the n-well capacitance for n-wells in a p++ wafer and a thin p– epitaxial film.

Another concern arises with regard to the use of tub breakdown elements. N-wells can charge during manufacturing processing leading to destruction of thin dielectric MOSFET structures. N-wells can also be used as a "floating gate tie-down" to prevent charging of nchannel MOSFET structures. With a variable epitaxial thickness, a p++ substrate and retrograde n-well, poor control is achieved over the n-well breakdown voltage. Accordingly, there is a need to provide a semiconductor construction and method of fabrication which is effective to provide good tolerance and control of the n-well breakdown voltage for n-wells in a p++ wafer and a thin p– epitaxial film.

Another concern is the development of a Zero threshold voltage MOSFET. "Zero VT" MOSFET transistors eliminate the p-well tub and place a standard MOSFET in the native p– epitaxial film. This reduces the threshold voltage of the Zero VT device. Thus the Zero VT device is more prone to leakage and has a lower MOSFET snapback voltage.

A still further concern arises in the context of a manufacturing environment when using the same base wafer for different CMOS technologies. Different device design points are defined such as low power design point, a high performance design point, and a high density design point. In some technologies, two or more objectives may be desirable but not the third. Additionally the same base wafer may be used for different technology generations. For example, 0.5 micron, 0.35 micron and 0.25 micron technology devices may all be currently manufactured in the same fabricator. Using the same wafer base allows for re-adjustment of product mix and generation mix midstream in the semiconductor manufacturing process. In p– wafers and no epitaxial wafers, this is not a concern. However, in p++ wafers with epitaxial films, there is a significant problem in achieving device design goals and using the same p++ wafer and fixed epitaxial film thickness. Thus there is a need to provide a means by which the same epitaxial film thickness and p++ wafers may be used for successive generations of technology scaling development.

P++ buried layers have been implemented into p– wafers to avoid epitaxial growth and to avoid p++ substrate wafers. In such applications, the intent is to avoid the added cost and expense of epitaxial film growth and p++ wafers. In such processes, the usage of the p++ buried implant has the utility of substituting the p++ wafers. There are several problem with that process implementation. First, the resistance using the p++ buried layer is higher than the p++ substrates, so there is no incentive to eliminate the P==substrate. Secondly, in such processes, there exists no denuded zone. This impacts both yield and leakage in VLSI circuits. As a result, the gate oxide integrity (GOI) is inadequate for DRAM development and leakage is inadequate for low power logic applications. Thus there is a need to provide a semiconductor construction and method of fabrication which is effective to address and improve upon these inadequacies.

With specific regard to trench DRAM structures, it is noted that epitaxial variations also influence the trench-gate induced diode leakage (GIDL or TGIDL) mechanism. Trench gate induced diode leakage current has been observed in many substrate plate type trench DRAM cells. Experimental and modeling results show that this is due to electric field-enhanced thermal generation (trap-state barrier lowering and trap-to-band tunneling) at the low electric field regime, and by band-to-band tunneling at the high electric field regime. Since the minority carrier generation is dependent upon the electric fields in the p+ substrate local to the n-well-to-substrate junction, the TGIDL current is influenced by the substrate doping concentration profile. As the epitaxial variation occurs, the trench capacitance of the storage node is modulated. The thicker the epitaxial film, the lower the trench DRAM storage node capacitance. To observe the relationship of increase TGIDL current with electric fields as a function of substrate doping concentration profile, the TGIDL current can be plotted against trench capacitance ratio at 3.4 volts and 0.0 volts trench-to-substrate DC bias. Epitaxial layer design plots of TGIDL current vs n-well breakdown voltage also show that TGIDL current increases with increasing n-well breakdown voltage due to epitaxial variations (n-well breakdown increases linearly with increasing epitaxial thickness in the n-well modulation regime). The increasing TGIDL current with increasing epitaxial thickness constrains the design point due to increasing TGIDL, current and decreasing storage node capacitance in shallow collar trench cells. Using a connecting p+ implant layer under the n-well in a substrate plate trench DRAM cell, the doping profile along the trench sidewall prevents the epitaxial modulation of the trench GIDL mechanism. Additionally, as the epitaxial region thickness increases, the depletion region increases along the trench sidewall. The lower the doping concentration, the more leakage occurs along the trench sidewall that is collected at the p++/n-well junction. Accordingly, there is a need to provide a semiconductor construction and method of fabrication which tends to prevent epitaxial variation on the trench GIDL mechanism.

SUMMARY OF THE INVENTION

A semiconductor device is provided which includes a P– epitaxial layer on a p+ substrate. In one embodiment, a connecting P++ buried layer implant is positioned within the device between the P++ substrate and the P– epitaxial layer. In another embodiment, a connecting p+ implant is placed within the epitaxial layer above the buried p+ blanket layer implant. In one alternative construction, the p+ buried layer implant layer formed between the substrate and the epitaxial layer is positioned at a uniform depth beneath the surface of the device. In yet another arrangement, the p+ blanket implant layer formed between the substrate and the epitaxial layer is positioned at non-uniform depths beneath the surface of the device. In an alternate arrangement, the P+ connecting implant is positioned below an N terminal of the device and in another arrangement the device includes a shallow P-well with the P+ connecting implant in a position within the epitaxial layer connecting the shallow P-well and the buried P+ blanket implant layer. In another construction, the device is formed adjacent to a trench region, with the trench region being separated from said semiconductor device by a dielectric layer.

A method for fabricating the semiconductor device described above includes providing a P– epitaxial layer on a p+ substrate. In one embodiment, a connecting P++ buried layer implant is positioned within the device between the P++ substrate and the P– epitaxial layer. In another embodiment, a connecting p+ implant is placed within the epitaxial layer above the buried p+ blanket layer implant. In one alternative methodology, the p+ buried layer implant layer formed between the substrate and the epitaxial layer is positioned at a uniform depth beneath the surface of the device. In yet another methodology, the p+ blanket implant layer formed between the substrate and the epitaxial layer is positioned at non-uniform depths beneath the surface of the device. In an alternate methodology, the P+ connecting implant is positioned below an N terminal of the device and in another methodology, a shallow P-well is formed with the P+ connecting implant being positioned within the epitaxial layer connecting the shallow P-well and the buried P+ blanket implant layer. In another methodology, the device is formed adjacent to a trench region, with the trench region being separated from said semiconductor device by a dielectric layer.

BRIEF DESCRIPTION OF THE DRAWINGS

A better understanding of the present invention can be obtained when the following detailed description of the preferred embodiments is considered in conjunction with the following drawings, in which.

DETAILED DESCRIPTION OF A PREFERRED EMBODIMENT OF THE INVENTION

Figure 1:
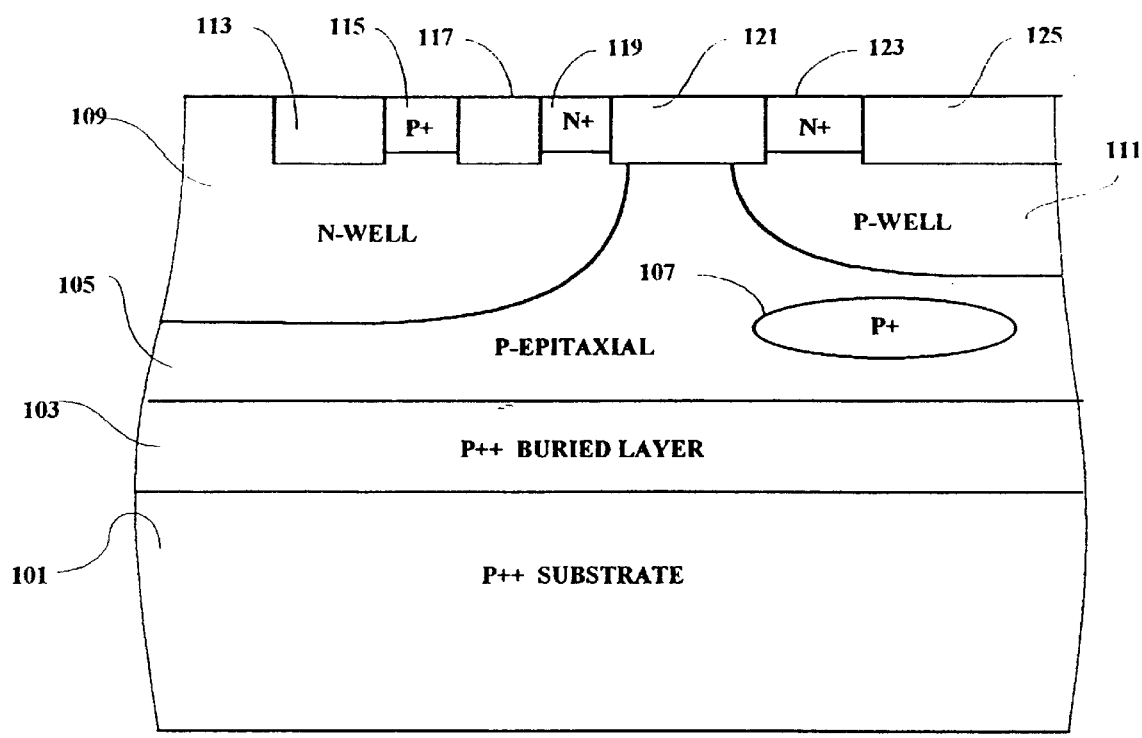
FIG. 1 is a diagram showing a cross-section of one embodiment of a semiconductor structure fabricated in accordance with the disclosed method of fabrication, and having a p-well and a uniform blanket p++ buried layer.

With reference to FIG. 1, there is shown a P++ substrate 101 beneath an implanted P++ buried layer 103. A P– epitaxial layer 105 is positioned above the buried P++ layer 103. A P+ connecting implant 107 is contained within the epitaxial layer 105 below a shallow P-well 111. A relatively deep N-well 109 is situated above the epitaxial layer 105 and displaced opposite the relatively shallow P-well 111. The top sulace of the cross-sectional view shown in FIG. 1 includes a series of insulating sections 113, 117, 121 and 125. N+ terminals are positioned between sections 117 and 121 and also between sections 121 and 125. A P+ terminal 115 is positioned between sections 113 and 117.

Figure 2:
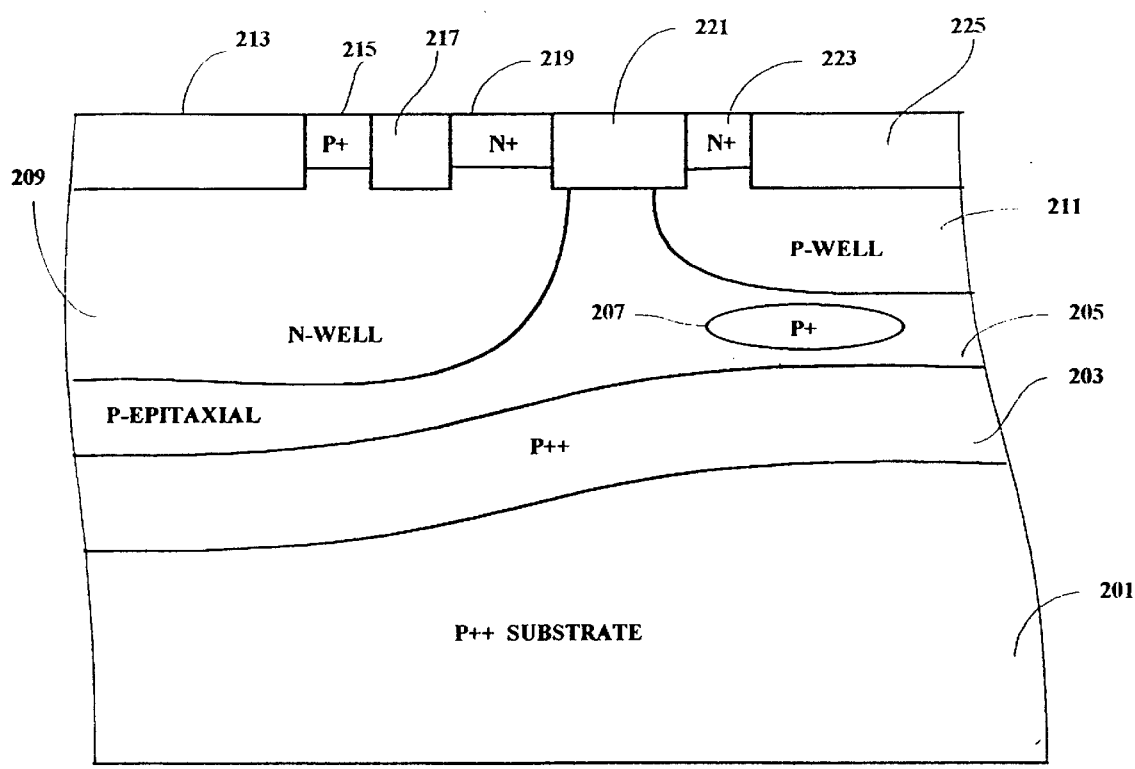
FIG. 2 is a diagram showing a cross-section of another embodiment of a semiconductor structure fabricated in accordance with the disclosed method of fabrication, having a p-well and a non-uniform buried layer.

In FIG. 2, there is shown a P++ substrate 201 beneath an implanted P++ buried layer 203. A P– epitaxial layer 205 is positioned above the buried P++ layer 203. A P+ connecting implant 207 is contained within the epitaxial layer 205 below a shallow P-well 211. A relatively deep N-well 209 is situated above the epitaxial layer 205 and displaced opposite the relatively shallow P-well 211. The top surface of the cross-sectional view shown in FIG. 2 includes a series of insulating sections 213, 217, 221 and 225. N+ terminals are positioned between sections 217 and 221 and also between sections 221 and 225. A P+ terminal 215 is positioned between sections 213 and 217.

The cross-sectional view of a semiconductor device shown in FIG. 2 is basically similar to the view shown in FIG. 1 except that the implanted buried P++ blanket layer 203 in FIG. 2 is shown positioned in a non-planar manner, having one portion of the blanket 203 being closer to the device surface under the shallow P+ well 211 and having another section of the blanket 203 being farther from the device surface under the N-well 209.

Figure 3:
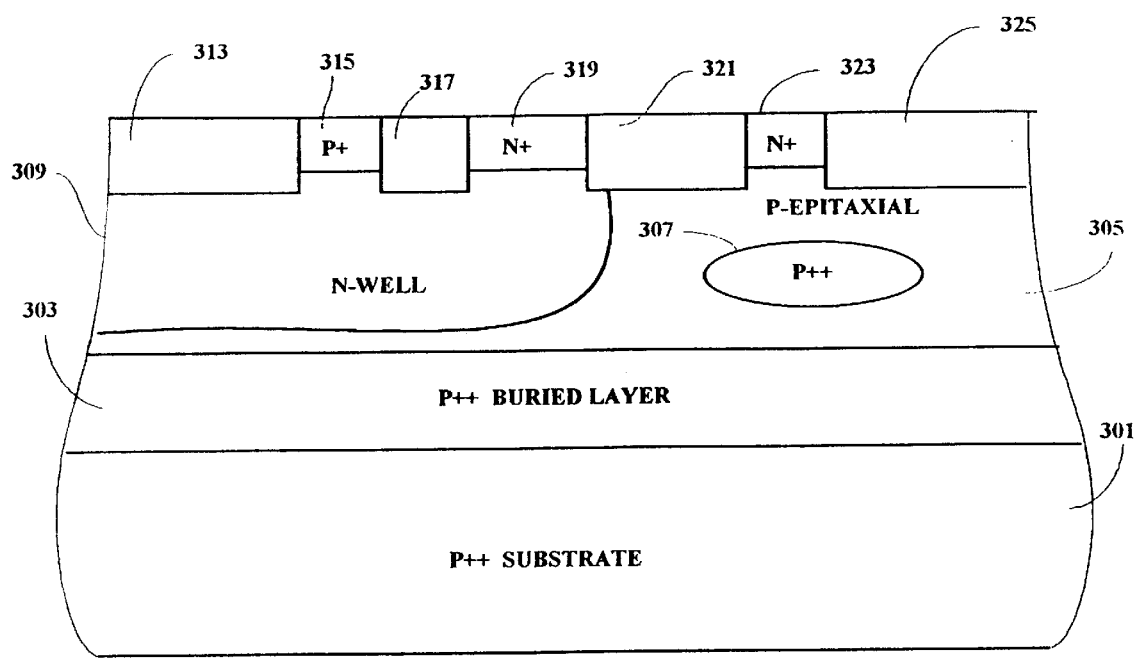
FIG. 3 is a diagram showing a cross-section of another embodiment of a semiconductor structure fabricated in accordance with the disclosed method of fabrication, and including a uniform blanket p++ buried layer with no p-well.

FIG. 3 shows another cross-sectional view of a semiconductor device with a slightly different configuration. In FIG. 3, there is shown a P++ substrate 301 beneath an implanted P++ buried layer 303. A P– epitaxial layer 305 is positioned above the buried P++ layer 303. A P+ connecting implant 307 is contained within the epitaxial layer 305 and displaced from and below an N+ device terminal 323. A relatively deep N-well 309 is situated above the epitaxial layer 305 and positioned below P+ and N+ device terminals 315 and 319. The top surface of the cross-sectional view shown in FIG. 3 includes a series of insulating sections 313, 317, 321 and 325. N+ terminals are positioned between sections 317 and 321 and also between sections 321 and 325. A P+ terminal 315 is positioned between sections 313 and 317.

The cross-sectional view of a semiconductor device shown in FIG. 3 is basically similar to the view shown in FIG. 1 except that the FIG. 3 structure does not include a shallow P-well. Instead, the P++ implant 307 is positioned within the epitaxial layer 305 below the N+ terminal 323. The FIG. 3 construction also includes a uniform P++ buried blanket layer 303 which is displaced a uniform distance from the surface of the device.

Figure 4:
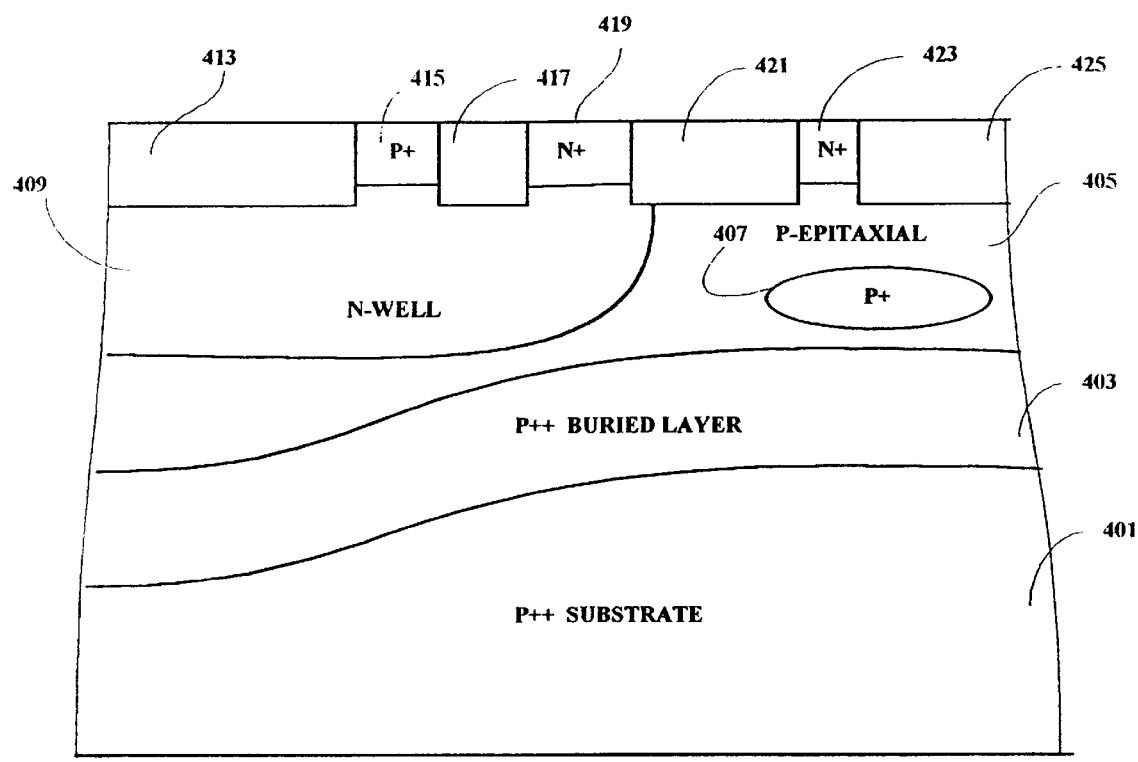
FIG. 4 is a diagram showing a cross-section of another embodiment of a semiconductor structure fabricated in accordance with the disclosed method of fabrication, and including a non-uniform p++ buried layer with no p-well.

In FIG. 4, there is shown another cross-sectional view of a semiconductor device with a slightly different configuration. In FIG. 4, there is shown a P++ substrate 401 beneath an implanted P++ buried layer 403. A P– epitaxial layer 405 is positioned above the buried P++ layer 403. A P+ connecting implant 407 is contained within the epitaxial layer 405 and displaced from and below an N+ device terminal 423. A relatively deep N-well 409 is situated above the epitaxial layer 405 and positioned below P+ and N+ device terminals 415 and 419. The top surface of the cross-sectional view shown in FIG. 4 includes a series of insulating sections 413, 417, 421 and 425. N+ terminals are positioned between sections 417 and 421 and also between sections 421 and 425. A P+ terminal 415 is positioned between sections 413 and 417.

The cross-sectional view of a semiconductor device shown in FIG. 4 is basically similar to the view shown in FIG. 3 except that the FIG. 4 includes a non-uniform P++ buried blanket layer 403 which is positioned in a non-planar manner, having one portion of the blanket 403 being closer to the device surface under the terminal 423 and having another section of the blanket 403 being farther from the device surface under the N-well 409.

Figures 5, 6:
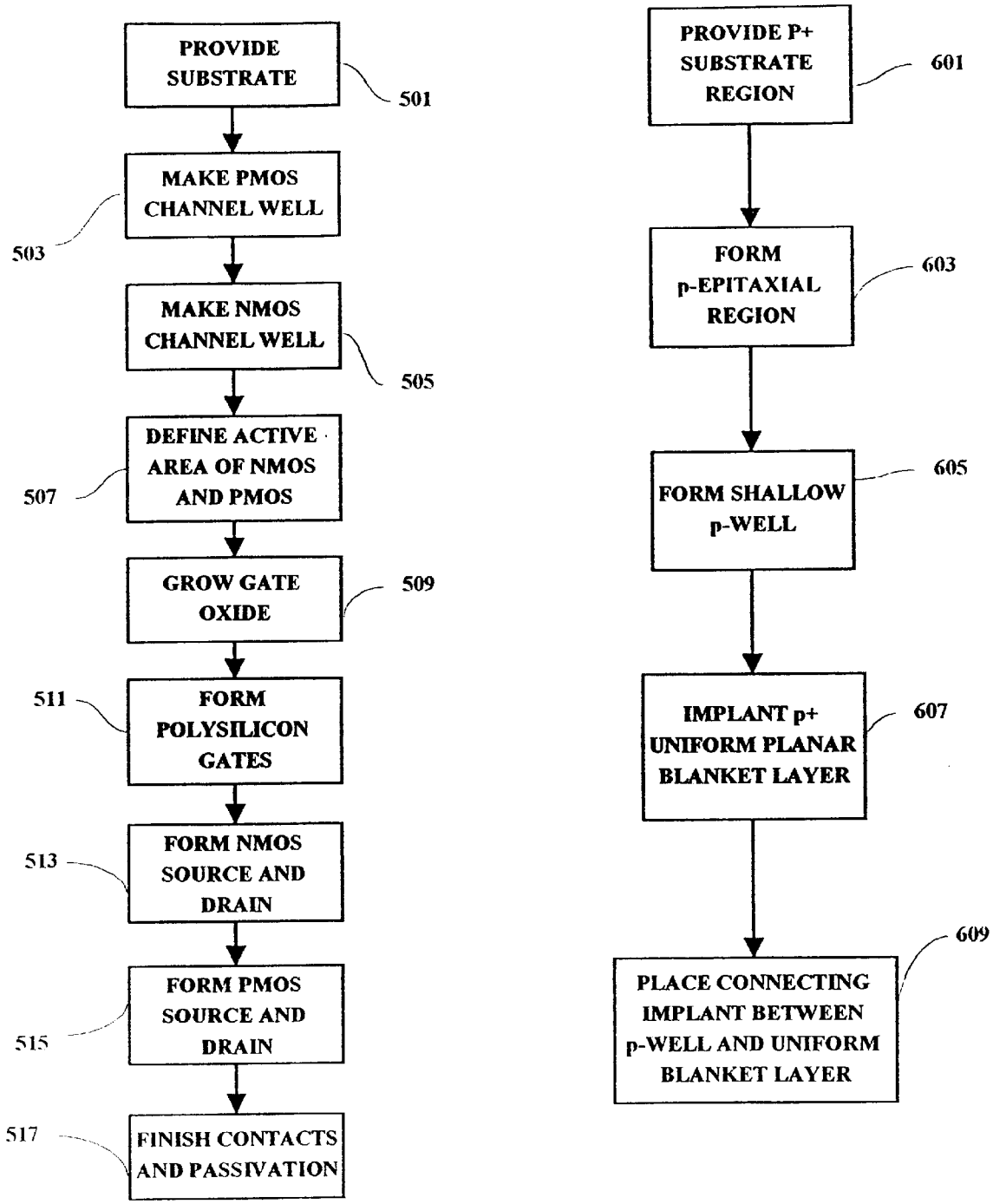
FIG. 5 is a flow chart illustrating a basic high level and well known method of CMOS semiconductor fabrication.
FIG. 6 is a simplified flow chart illustrating the improved steps within the CMOS semiconductor fabrication process in accordance with the present disclosure.

In FIG. 5 there is shown a known methodology at a high level for the fabrication of CMOS devices. Initially a semiconductor substrate (typically silicon) is provided 501 and doped with a P-type material such as Boron. Next a PMOS channel well is defined 503 using a conventional mask and etch process and an impurity such as phosphorus is introduced deep into the area using a conventional implantation or diffusion technique. Next an NMOS channel well is made 505 and the active areas of the NMOS and PMOS devices are defined 507. Next the gate oxides are grown 509 and the polysilicon gates are formed 511. The NMOS source and drain are formed 513 and the PMOS source and drain are also formed 515. Finally, the contacts are finished and a passivation layer is applied 517.

FIG. 6 illustrates the principal process steps utilized to fabricate the devices shown in FIG. 1. Initially a P+ substrate is provided 601 and a P epitaxial layer is grown to form a P epitaxial region 603. Next, in one embodiment, a shallow P well is formed 605 and a uniform P+ blanket layer is implanted 607 between the epitaxial layer and the substrate. Next, a connecting P+ implant is positioned within the epitaxial layer between the shallow P well and the uniform blanket implanted layer. The device fabrication is completed in a conventional manner.

Figures 7, 8, 9:
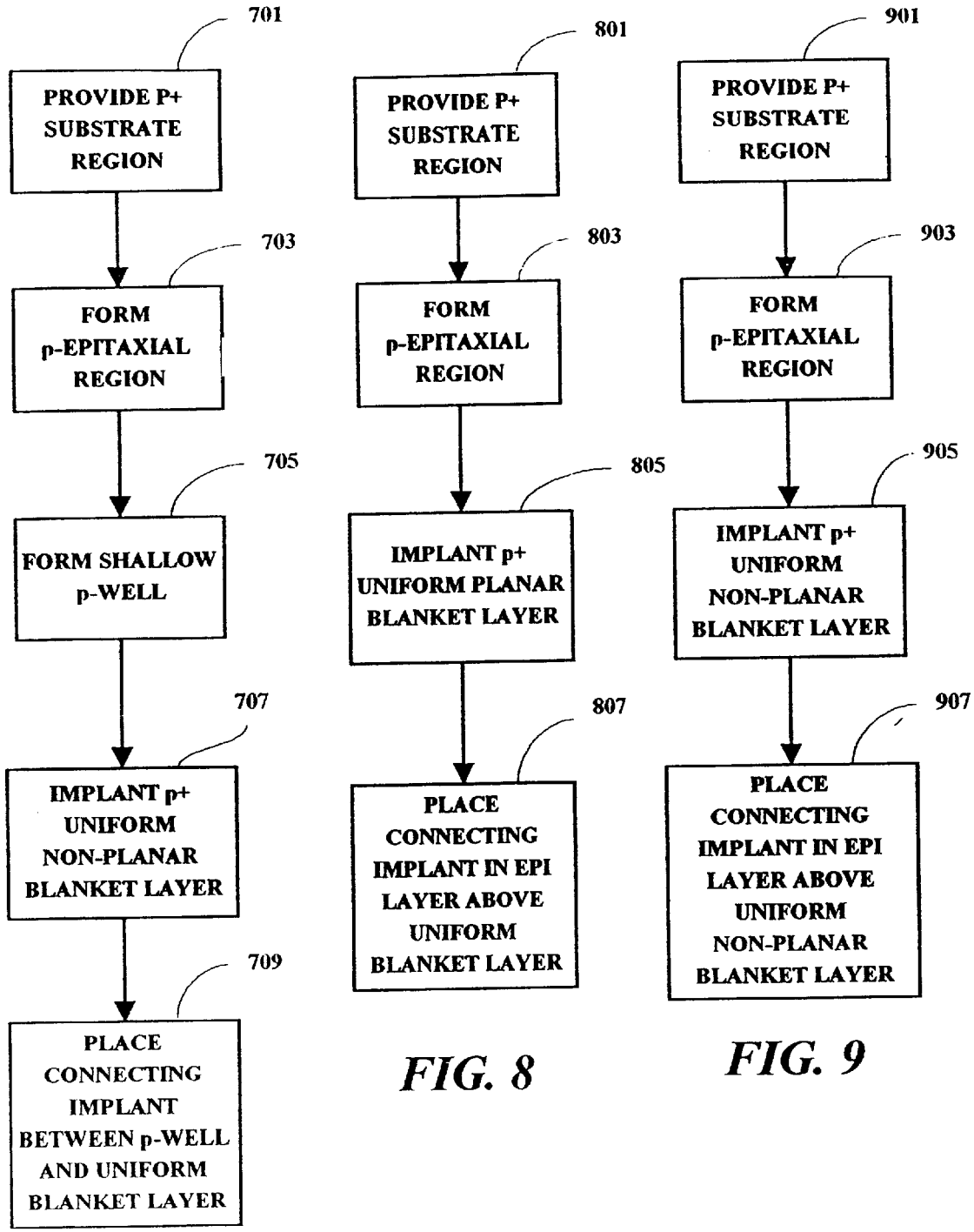
FIG. 7 is a simplified flow chart illustrating an alternative methodology in the semiconductor fabrication process disclosed herein.
FIG. 8 is a simplified flow chart illustrating another alternative methodology in the semiconductor fabrication process disclosed herein.
FIG. 9 is a simplified flow chart illustrating yet another alternative methodology in the semiconductor fabrication process disclosed herein.

In FIG. 7, the fabrication steps are similar to those in FIG. 6 except that blanket layer 203 is non-planar. The method initially provides a P+ substrate 701, then a p– epitaxial region is formed 703 followed by the formation of a shallow p-well 705. Next a uniform non-planar P+ blanket 203 layer is implanted 707. Then a connecting P+ implant is placed the shallow P-well and the uniform blanket layer 203. The fabrication process is then completed in conventional manner.

FIG. 8 illustrates the steps implemented in fabricating the structure shown in FIG. 3, which is similar to that shown in FIG. 2 except that there is no p-well. After a P+ substrate region is provided 801 and a P+ epitaxial region is formed 803, a P++ uniform planar buried blanket layer 303 is implanted 805 and a connecting P++ implant is formed 807 in the Epitaxial layer 305 above the uniform blanket layer 303 and beneath the N terminal 323.

In FIG. 9, the methodology illustrated is implemented to form a non-planar P++ buried layer 403 as seen in FIG. 4 rather than the substantially planar layer as shown in FIG. 3. Again a P+ substrate region is formed 901 and a P– epitaxial region is developed or formed 903. Next a P+ non-planar buried layer 403 is implanted 905 between the epitaxial region 405 and the buried layer 403 below the N terminal 403.

Figure 10:
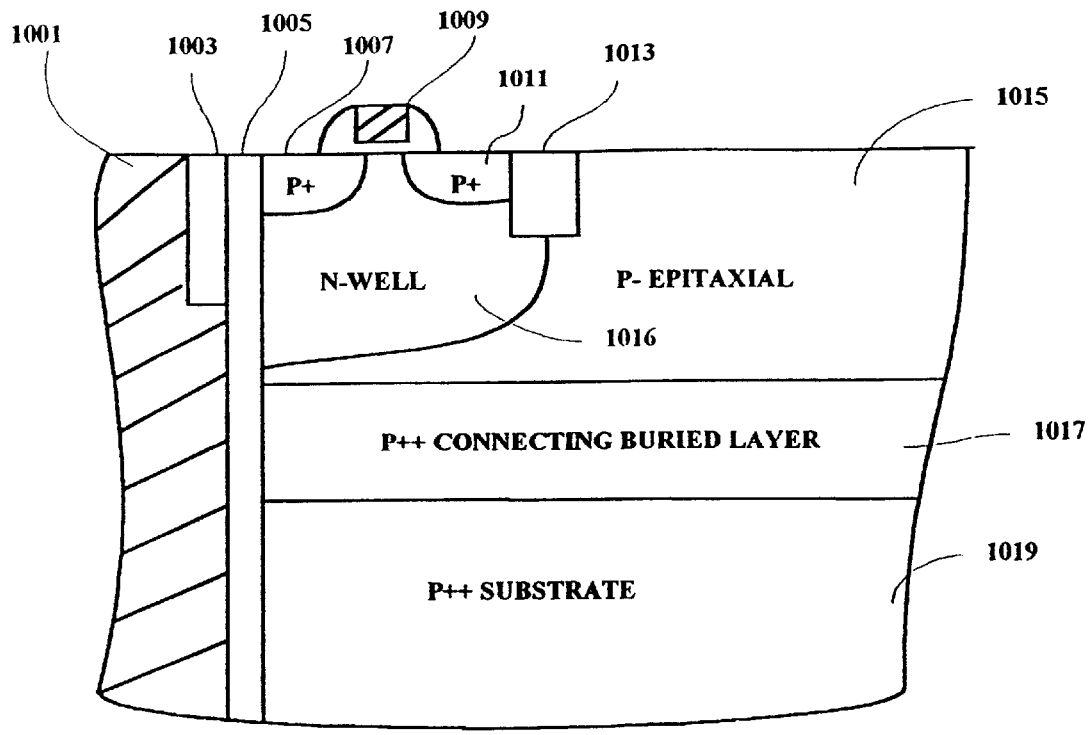
FIG. 10 is a diagram showing a cross-section of one embodiment of a semiconductor structure fabricated in accordance with the disclosed method of fabrication, and including a combination of a polysilicon trench structure and a planar connecting buried P++ layer.

In FIG. 10, there is illustrated an example of a semiconductor pnp transistor with a buried connecting planar implant P++ layer 1017 arranged adjacent to a polysilicon trench region 1001. Dielectric sections 1003 and 1005 are arranged to separate the polysilicon trench region 1001 from a pnp transistor structure including a p+ terminal 1007, a gate 1009, p+ terminal 1011, and a divider section 1013. The structure also includes a P– epitaxial layer 1015 positioned between the device surface and a P++ connecting buried layer implant 1017, which is, in turn, arranged upon a P++ substrate 1019. The P– epitaxial layer 1015 has disposed thereon an n-well structure 1016.

Figure 11:
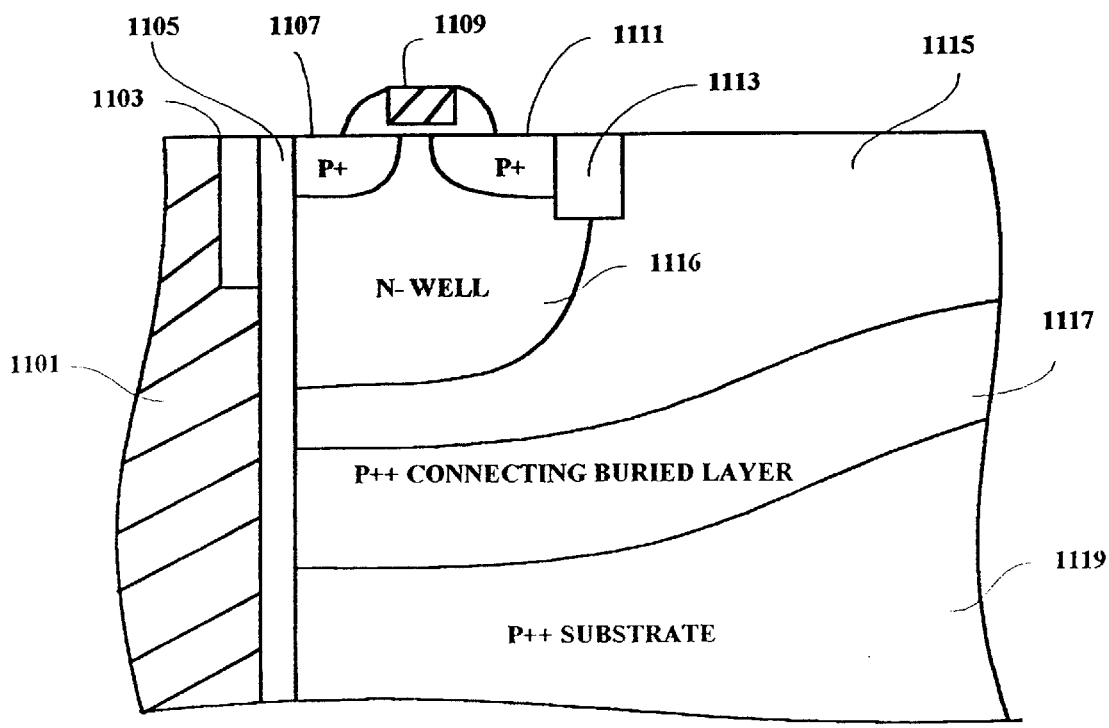
FIG. 11 is a diagram showing a cross-section of one embodiment of a semiconductor structure fabricated in accordance with the disclosed method of fabrication, and including a combination of a polysilicon trench structure and a non-planar connecting buried P++ layer.

FIG. 11 is similar to FIG. 10 except that FIG. 11 illustrates a structure which includes a non-planar P++ connecting buried layer implant 1117. In FIG. 11, a polysilicon trench region 1101 is arranged adjacent to dielectric sections 1103 and 1105. Section 1105 separates the polysilicon trench region 1101 from a pnp transistor construction including a P+ terminal 1107, a gate terminal 1109, and another P+ terminal 1111. A divider section 1113 separates the P+ terminal from an epitaxial layer 1115. A n-well 1116 is disposed below the P+ terminals 1107 and 1111. A non-planar connecting buried implant layer 1117 is disposed above a P++ substrate region 1119, and below the epitaxial layer 1115.

Figure 12:
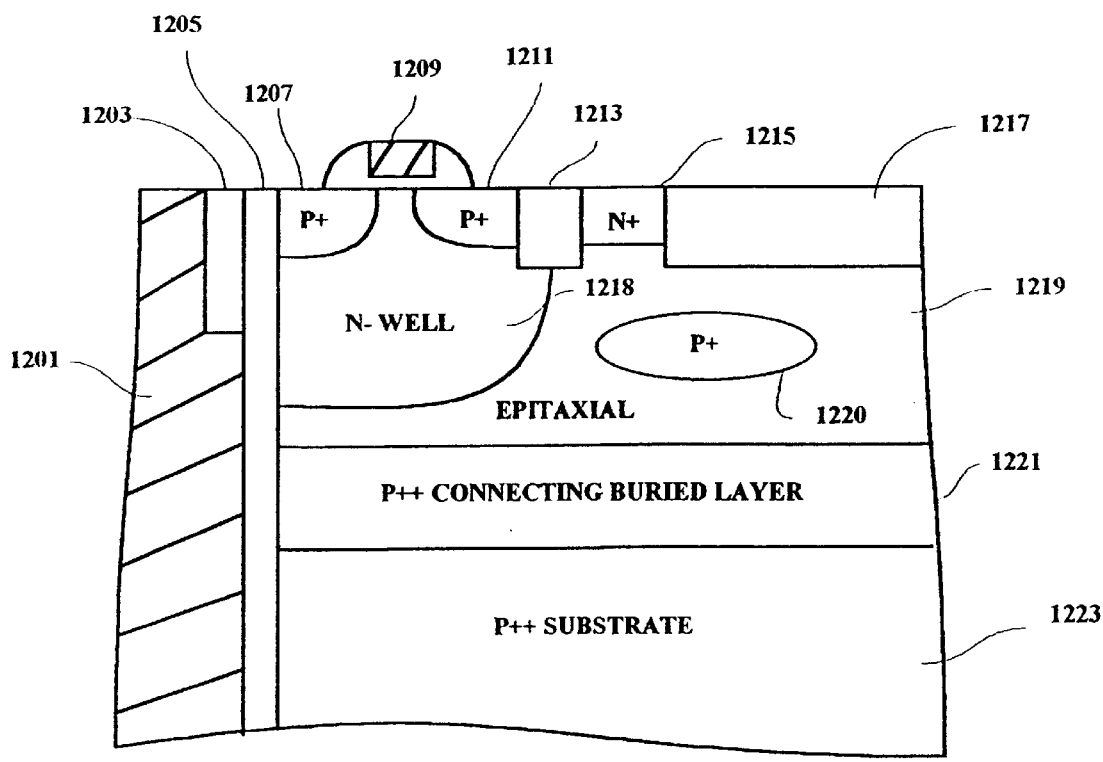
FIG. 12 is a diagram showing a cross-section of one embodiment of a semiconductor structure fabricated in accordance with the disclosed method of fabrication, and including a combination of a polysilicon trench structure, a planar connecting implanted buried P++ layer, and a P+ implanted cell. structure within an epitaxal region.

FIG. 12 illustrates a similar structure as that shown in FIG. 10 except FIG. 12 includes an implanted P+ cell 1220 within an epitaxial layer 1219. As shown in FIG. 12, there is illustrated an example of a semiconductor pnp transistor with a buried connecting planar implant P++ layer 1221 arranged adjacent to a polysilicon trench region 1201. Dielectric sections 1203 and 1205 are arranged to separate the polysilicon trench region 1201 from a pnp transistor structure including a p+ terminal 1207, a gate 1209, p+ terminal 1211, and a divider section 1213. The structure also includes a P− epitaxial layer 1219 positioned between the device surface and a P++ connecting buried layer implant 1221, which is, in turn, arranged upon a P++ substrate 1223. The P− epitaxial layer 1219 has disposed thereon an n-well structure 1218 and also an implanted P+ connecting cell 1220. The P+ connecting cell 1220 is arranged below a N+ terminal 1215 and divider 1217.

In operation, the method described herein provides semiconductor structures which are insensitive to epitaxial film thickness variations and significantly alleviate the latchup and sheet resistance control problems. This occurs because both the p+ connecting buried layer implant and the p+ epitaxial buried implant are added using a high energy implanter with a defined dosage and energy. The p+ planar or non-planar blanket implant is placed in the region where the p++ substrate doping concentration is below its maximum background doping concentration. By adding both the p+ planar/non-planar buried implant and the p+ connecting implant in the epitaxial region, a low resistance shunt is established between the p++ substrate and the pwell and a well defined metallurgical junction is formed between the n-well and the p++ substrate. In this way a low resistance shunt is established between the p-well and the p++ substrate.

Additionally, n-well sheet resistance and capacitance tolerance is tightly controlled The operation of the high dopant implants is such that the bipolar current gain of the parasitic npn transistors will; be reduced as a result of recombination in the base region due to the p+ buried connecting blanket and the p+ epitaxial connecting implant. For latchup, there will be an improvement in the latchup immunity as a result of the increase in the latchup trigger voltage. For ESD, there will be an improvement in the ESD immunity as a result of the increase in the local intrinsic temperature, a better thermal resistance reduction and a low impedance path to the p++ substrate.

For SER, there will be an improvement in the SER robustness as a result of the increase in the electron-hole pair recombination in the epitaxial region and a reduction in the low dopant part of the p++ substrate. Additionally, the alpha particle "funnel" will be significantly reduced thereby improving the alpha particle SER immunity. For MOSFET snapback, there will be an improvement in the snapback holding voltage as a result of the reduced IR drop in the epitaxial region between the p++ substrate and the MOSFET transistor. For TGIDL, there will be an improvement in the trench storage node leakage as a result of a decrease in depletion region penetration in the epitaxial region and in the low dopant part of the p++ substrate hence reducing the minority carrier generation along the trench sidewall depletion region.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A semiconductor device comprising:

a substrate region of a first type of semiconductor materal;

an epitaxial region of said first type of semiconductor material above said substrate region;

a connecting implant of said first type of semiconductor material between said substrate region and a top surface of the semiconductor device;

a first well of said first type of semiconductor material in said epitaxial region, said first well being positioned above said connecting implant and connected to a first connecting terminal of the semiconductor device; and a second well, said second well being of a second type of semiconductor material, said second well being connected to second and third connecting terminals of the semiconductor device.

2. The semiconductor device as set forth in claim 1 wherein said first well is a shallow well relative to said second well.

3. The semiconductor device as set forth in claim 2 wherein said first connecting terminal is made of said second type of semiconductor material.

4. The semiconductor device as set forth in claim 3 wherein said second and third connecting terminals are made of said first and second types of semiconductor materials, respectively.

5. The semiconductor device as set forth in claim 4 wherein said first type of semiconductor material is a P-type material and said second type of semiconductor material is an N-type material.

* * * * *